(12) United States Patent
Koh

(10) Patent No.: US 10,304,504 B2
(45) Date of Patent: May 28, 2019

(54) DATA ALIGNMENT CIRCUIT AND SEMICONDUCTOR DEVICE INCLUDING THE SAME

(71) Applicant: SK hynix Inc., Gyeonggi-do (KR)

(72) Inventor: In-Sung Koh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/831,071

(22) Filed: Dec. 4, 2017

(65) Prior Publication Data

US 2018/0336938 A1    Nov. 22, 2018

(30) Foreign Application Priority Data

May 22, 2017   (KR) .................. 10-2017-0062895

(51) Int. Cl.
*G11C 7/10* (2006.01)
*G11C 7/22* (2006.01)

(52) U.S. Cl.
CPC ............ *G11C 7/1093* (2013.01); *G11C 7/109* (2013.01); *G11C 7/1087* (2013.01); *G11C 7/222* (2013.01); *G11C 7/1084* (2013.01); *G11C 2207/107* (2013.01); *G11C 2207/2272* (2013.01)

(58) Field of Classification Search
CPC ..... G11C 7/1093; G11C 7/1087; G11C 7/222; G11C 7/1084; G11C 11/4093; G11C 11/4076; G11C 7/1012
See application file for complete search history.

(56) References Cited

U.S. PATENT DOCUMENTS

| 7,499,343 | B2 * | 3/2009 | Kang | .................. | G11C 7/1006 |
|  |  |  |  |  | 365/189.05 |
| 2015/0063008 | A1 * | 3/2015 | Moon | .................. | G11C 7/1087 |
|  |  |  |  |  | 365/154 |

FOREIGN PATENT DOCUMENTS

| KR | 1020050076117 | 7/2005 |
|---|---|---|
| KR | 1020160075058 | 6/2016 |

* cited by examiner

*Primary Examiner* — David Lam
(74) *Attorney, Agent, or Firm* — IP & T Group LLP

(57) ABSTRACT

A semiconductor device includes an information storage circuit suitable for outputting an operating frequency information according to a command; and a data alignment circuit including a plurality of latch units and suitable for aligning input data inputted in series according to a data strobe signal, by determining activation of at least one latch unit among the plurality of latch units depending on the operating frequency information.

20 Claims, 5 Drawing Sheets

DATA ALIGNMENT CIRCUIT AND SEMICONDUCTOR DEVICE INCLUDING THE SAME

CROSS-REFERENCE TO RELATED APPLICATION

This application claims priority under 35 U.S.C. § 119 to Korean Patent Application No. 10-2017-0062895, filed on May 22, 2017, in the Korean Intellectual Property Office, the disclosure of which is incorporated herein by reference in its entirety.

TECHNICAL FIELD

Exemplary embodiments relate to a semiconductor device, and more particularly, to a semiconductor device which receives data and a data strobe signal from a controller.

DISCUSSION OF THE RELATED ART

When receiving data from a controller, a semiconductor device also receives a data strobe signal together with the data. The data strobe signal is used to synchronize the semiconductor device with the controller when receiving data, and ensures the stable transmission of data. More specifically, the semiconductor device may align in parallel the data which are transmitted to the semiconductor memory device in series, in response to the data strobe signal, and transfer the aligned data in an internal circuit, for example, a memory cell array for storing.

Meanwhile, in a read or write operation, a mode register set (MRS) may set a burst length (BL) for the data transmission so that the semiconductor device may successively input/output data in a burst operation according to the burst length (BL). The burst length (BL) for a burst operation may be set to various values such as 4, 8, 16 and so on. For example, in the case where the burst length is set to 8 (BL=8), the semiconductor device may successively receive 8-bit data in a write operation or may successively output 8-bit data in a read operation.

A semiconductor device typically includes a data alignment circuit for aligning data which are successively inputted according to a burst length (BL) in response to a data strobe signal. The data alignment circuit may include a plurality of latch units which latch and output input data according to the data strobe signal, and may align in parallel data which are inputted in series. However, existing data alignment circuits may consume large power amounts which increase significantly the power requirements of semiconductor devices. Typically, the data alignment circuit includes a large number of latch units to ensure a required timing margin, however, current consumption increases according to the number of the latch units. Therefore, an improved data alignment circuit that is capable of reducing current consumption while ensuring a timing margin would be highly desirable in the semiconductor industry.

SUMMARY

Various embodiments of the present invention are directed to an improved data alignment circuit and a semiconductor device including the same that control the activation of latches included in the data alignment circuit for reducing the overall power requirements of the data alignment circuit and of the semiconductor memory device.

In an embodiment, a semiconductor device may include: an information storage circuit suitable for outputting an operating frequency information according to a command; and a data alignment circuit including a plurality of latch units and suitable for aligning input data inputted in series according to a data strobe signal, by determining activation of at least one latch unit among the plurality of latch units depending on the operating frequency information.

In an embodiment, a data alignment circuit may include: a first latch unit suitable for storing a first bit group of input data in response to a first alignment control signal; a second latch unit suitable for storing a second bit group of the input data in response to a second alignment control signal which is activated after the first alignment control signal; and a third latch unit activated depending on an operating frequency information, and suitable for re-storing the first bit group stored in the first latch unit in response to the second alignment control signal.

In an embodiment, a data alignment operation may include: storing a first bit group of input data in response to a first alignment control signal; storing a second bit group of the input data in response to a second alignment control signal which is activated after the first alignment control signal; and re-storing the stored first bit group in response to the second alignment control signal, wherein the re-storing is selectively performed depending on an operating frequency information.

In the present technology, by performing a data alignment operation differently under a high frequency condition that is higher than a predetermined frequency and a low frequency condition equal to or lower than the predetermined frequency, it is possible to reduce current consumption due to the latches under the low frequency condition and ensure stability under the high frequency condition.

These and other features and advantages of the present invention will become apparent to those skilled in the art of the present invention from the following detailed description in reference to the accompanying drawings.

DETAILED DESCRIPTION

Figure 1:
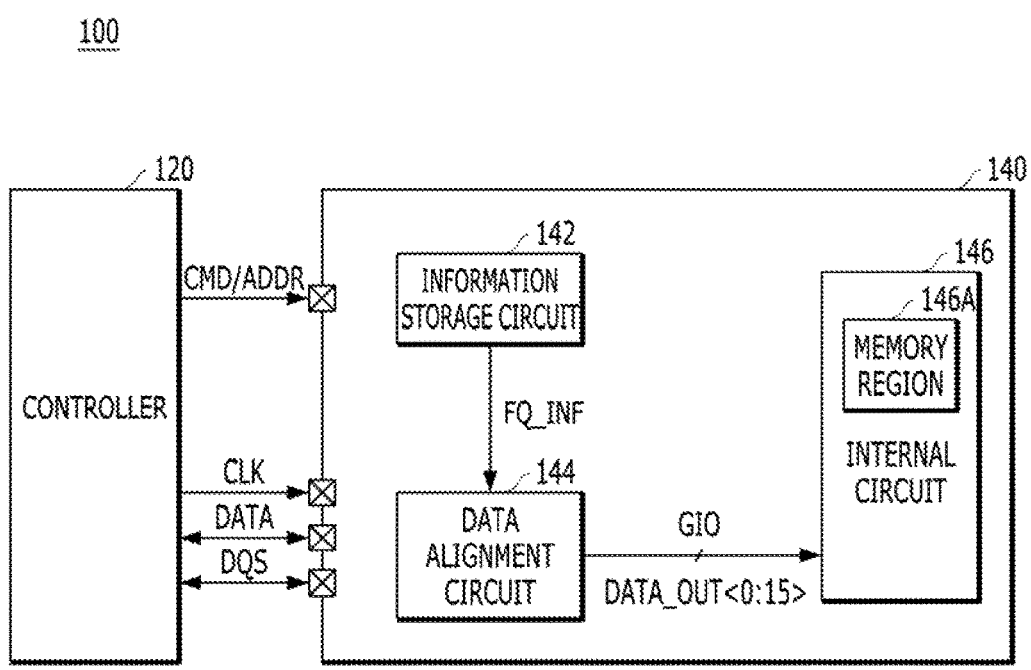
FIG. 1 is a block diagram illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, a semiconductor device will be described by taking a memory device as an example. However, it is to be noted that the present disclosure is not limited thereto. The present disclosure may be applied to any semiconductor device which receives data, a data strobe signal and a clock signal from a controller.

FIG. 1 is a block diagram illustrating a memory system 100 in accordance with an embodiment of the present invention.

Referring to FIG. 1, the memory system 100 may include a controller 120 and a memory device 140.

The controller 120 may control the general operations of the memory device 140. The controller 120 may transfer a clock signal CLK, a command CMD, an address ADDR, a data strobe signal DQS and data DATA to the memory device 140, and may receive a data strobe signal DQS and data DATA from the memory device 140. The command CMD may include a read command (RD), a write command (WT) or the like.

Meanwhile, the data DATA transferred between the controller 120 and the memory device 140 may be inputted in series according to a burst length (BL). For example, in the case where a burst length is 16 (BL=16), 16-bit data may be successively received in a write operation or 16-bit data may be successively outputted in a read operation. Each of the memory device 140 and the controller 120 may perform a data alignment operation of aligning data inputted in series and outputting parallel data.

The memory device 140 may include an information storage circuit 142, a data alignment circuit 144 and an internal circuit 146.

The information storage circuit 142 may store setting information on operation modes (hereinafter, referred to as "operation mode information") according to various operation situations. The information storage circuit 142 may be embodied as a mode register set (MRS) which is provided to store respective operation mode information of a memory device. The operation mode information may include a voltage information, an operating frequency information, a temperature information and so forth. The information storage circuit 142 may output or reset an operation mode information stored therein depending on the command CMD (for example, an initialization signal or an MRS control signal) provided from the controller 120. Hereinafter, in order to sufficiently explain the gist of the present disclosure, it will be described as an example that the information storage circuit 142 outputs an operating frequency information FQ_INF.

Meanwhile, in the memory system 100, a read latency (RL) and a write latency (WL) are set between the memory device 140 and the controller 120 such that the controller 120 may stably control the memory device 140. The read latency (RL) designates the time that the memory device 140 outputs valid output data as measured by the number of clocks, after the read command is applied from the controller 120. The write latency (WL) designates the time that input data are inputted to the memory device 140 as measured by the number of clocks, after the write command is applied from the controller 120. The read latency (RL) and the write latency (WL) may be stored in the MRS which is included in the memory device 140, and may be outputted depending on the command CMD provided from the controller 120. In the embodiment of the present disclosure, the read latency (RL) or the write latency (WL) outputted from the MRS may be included in the operating frequency information FQ_INF.

The data alignment circuit 144 includes a plurality of latch units (not shown) which align input data DATA inputted in series in correspondence to a burst length (BL), according to the data strobe signal DQS, and may determine activation of at least one latch unit among the plurality of latch units depending on the operating frequency information FQ_INF. The data alignment circuit 144 may output aligned data DATA_OUT<0:15> to a global data line GIO. The data alignment circuit 144 may activate all of the plurality of latch units when the operating frequency information FQ_INF indicates an operation under a high frequency condition (hereinafter, referred to as a "high frequency operation"), and may deactivate at least one latch unit among the plurality of latch units when the operating frequency information FQ_INF indicates an operation under a low frequency condition (hereinafter, referred to as a "low frequency operation"). The data alignment circuit 144 may perform a data alignment operation differently in a high frequency operation and a low frequency operation by determining the high frequency operation in the case where the operating frequency information FQ_INF is higher than a predetermined frequency (for example, 2133 Mbps) and determining the low frequency operation in the case where the operating frequency information FQ_INF is equal to or lower than the predetermined frequency.

The internal circuit 146 includes a memory region 146A which includes a plurality of memory cells, and may perform an operation corresponding to the command CMD (for example, a read operation or a write operation), for the aligned data DATA_OUT<0:15> transferred through the global data line GIO, on the memory region 146A corresponding to the address ADDR, in synchronization with the clock signal CLK. For example, when the command CMD corresponding to a write operation, i.e., the write command, is inputted, the internal circuit 146 may write the aligned data DATA_OUT<0:15> in memory cells selected by the address ADDR among the plurality of memory cells included in the memory region 146A.

Hereinafter, a concrete configuration of a memory device in accordance with an embodiment will be described with reference to the drawings. Hereinafter, a case where a burst length is 16 (BL=16) will be described as an example.

Figure 2:
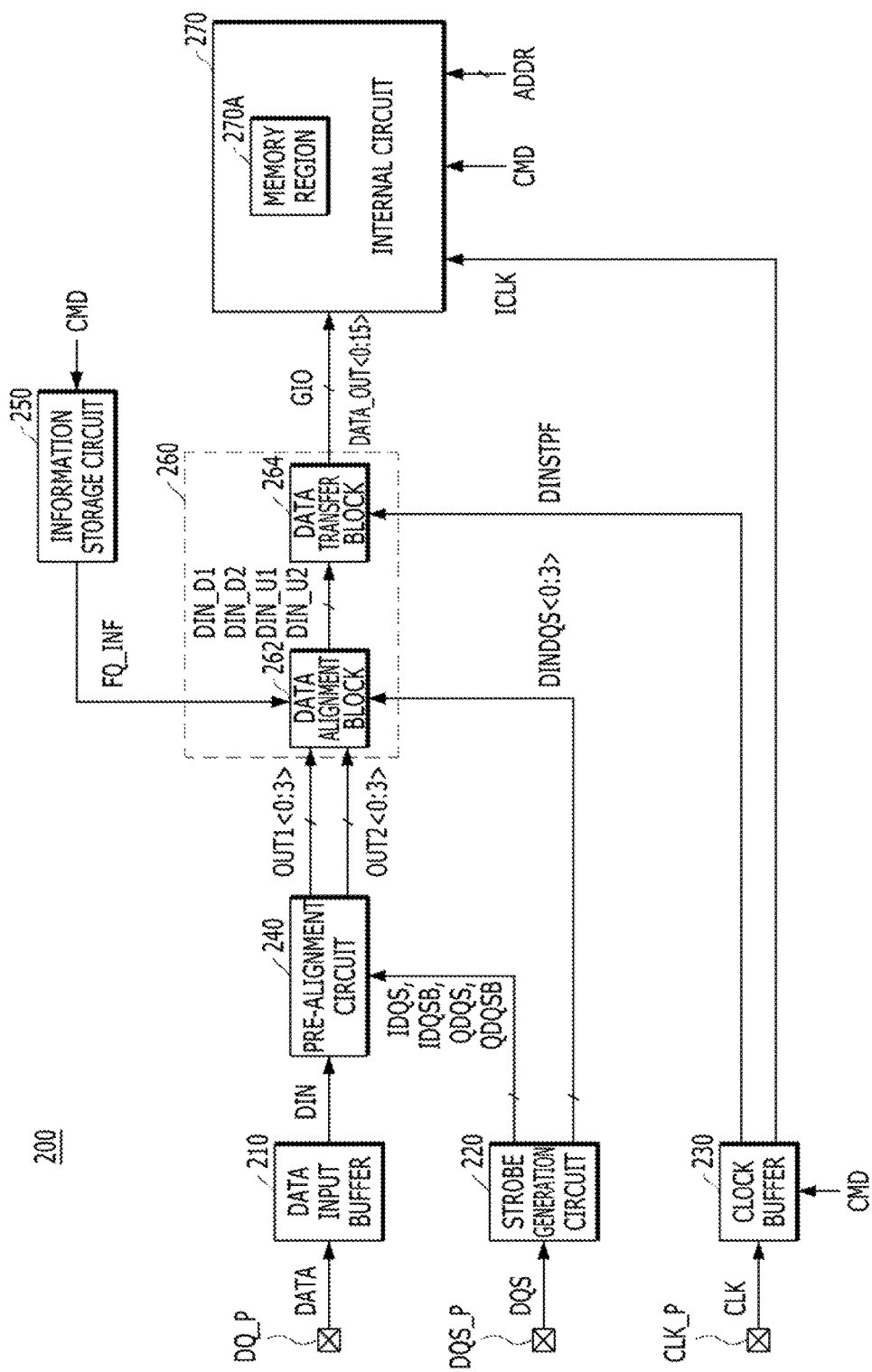
FIG. 2 is a block diagram illustrating a memory device in accordance with an embodiment of the present invention.
Figure 3:
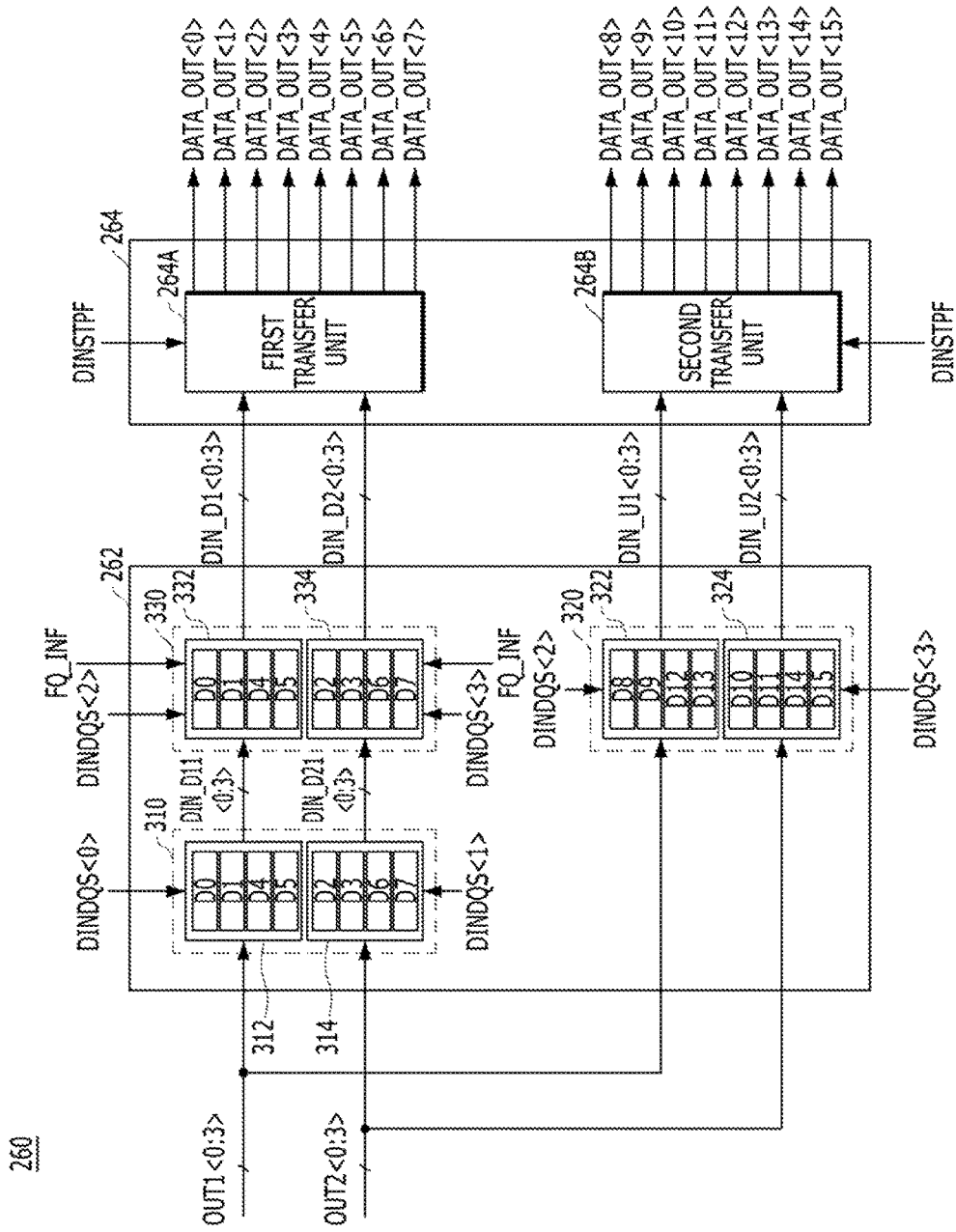
FIG. 3 is a detailed block diagram illustrating a data alignment circuit shown in FIG. 2.

FIG. 2 is a block diagram illustrating a memory device 200 in accordance with an embodiment of the present invention. FIG. 3 is a detailed block diagram illustrating a data alignment circuit 260 shown in FIG. 2.

Referring to FIG. 2, the memory device 200 may include a data input buffer 210, a strobe generation circuit 220, a clock buffer 230, a pre-alignment circuit 240, an information storage circuit 250, the data alignment circuit 260 and an internal circuit 270.

The data input buffer 210 may receive and buffer input data DATA of 16 bits which are inputted in series through a data pad DQ_P, and may output internal input data DIN.

The strobe generation circuit 220 may generate a plurality of internal strobe signals IDQS, QDQS, IDQSB and QDQSB and a plurality of alignment control signals DINDQS<0:3> based on a data strobe signal DQS which is inputted through a data strobe pad DQS_P. The strobe generation circuit 220 may generate the plurality of internal strobe signals IDQS, QDQS, IDQSB and QDQSB which are sequentially activated, by dividing a frequency of the data strobe signal DQS. The strobe generation circuit 220 may generate first to fourth internal strobe signals IDQS, QDQS, IDQSB and QDQSB which have a cycle of two times the data strobe signal DQS and are respectively activated at the phases of 0, 90, 180 and 270 degrees of the data strobe signal DQS. Also, the strobe generation circuit 220 may generate the plurality of alignment control signals DINDQS<0:3> which are sequentially activated after a point of time at which all of the first to fourth internal strobe signals IDQS, QDQS, IDQSB and QDQSB are activated. The plurality of alignment control signals DINDQS<0:3> may include a first alignment control signal DINDQS<0:1> and a second alignment control signal DINDQS<2:3>. Each of the first alignment control signal DINDQS<0:1> and the second alignment control signal DINDQS<2:3> may have a cycle of two times the first to fourth internal strobe signals IDQS, QDQS, IDQSB and QDQSB. A first bit DINDQS<0> and a second bit DINDQS<1> of the first alignment control signal DINDQS<0:1> may be signals which are sequentially activated by a predetermined clock unit (for example, 1*tCK), and a first bit DINDQS<2> and a second bit DINDQS<3> of the second alignment control signal DINDQS<2:3> may be signals which are sequentially activated by a predetermined clock unit (for example, 1*tCK).

Meanwhile, although not shown in a drawing, a data strobe buffer which buffers and outputs the data strobe signal DQS may be disposed between the data strobe pad DQS_P and the strobe generation circuit 220. According to an embodiment, a data strobe buffer may be disposed in the strobe generation circuit 220.

The clock buffer 230 may receive and buffer a clock signal CLK which is inputted through a clock pad CLK_P, and output an internal clock signal ICLK. Moreover, the clock buffer 230 may generate a transfer control signal DINSTPF which is activated at a predetermined point of time, based on a command CMD and the clock signal CLK. The predetermined point of time may be after all of the first alignment control signal DINDQS<0:1> and the second alignment control signal DINDQS<2:3> are activated. The clock buffer 230 may activate the transfer control signal DINSTPF after a data alignment operation is completed after receiving the command CMD, in consideration of a latency such as a write latency (WL).

The pre-alignment circuit 240 may latch the internal input data DIN inputted in series, by using the first to fourth internal strobe signals IDQS, QDQS, IDQSB and QDQSB, and may align the latched input data into a lower bit group and an upper bit group and sequentially output the lower bit group and the upper bit group to first and second output lines OUT1<0:3> and OUT2<0:3>. For example, when assuming that the internal input data DIN of 16 bits are inputted in series in the sequence of D0 to D15, the pre-alignment circuit 240 may first output a lower bit group D0 to D7 of 8 bits to the first and second output lines OUT1<0:3> and OUT2<0:3>, and then output an upper bit group D8 to D15 of 8 bits, to the first and second output lines OUT1<0:3> and OUT2<0:3>. Since the internal input data DIN are latched by using the first to fourth internal strobe signals IDQS, QDQS, IDQSB and QDQSB which have a cycle of two times the data strobe signal DQS, the data transferred to the first and second output lines OUT1<0:3> and OUT2<0:3> from the pre-alignment circuit 240 may have a width of at least two times the valid window of the internal input data DIN. Thus, the pre-alignment circuit 240 may sequentially output the lower bit group and the upper bit group of the internal input data DIN while securing the timing margin of the internal input data DIN.

Hereinafter, it will be described as an example that the pre-alignment circuit 240 outputs four lower bits D0, D1, D4 and D5 and four lower bits D2, D3, D6 and D7 of the internal input data DIN to the first output lines OUT1<0:3> and the second output lines OUT2<0:3>, respectively, and then outputs four upper bits D8, D9, D12 and D13 and four upper bits D10, D11, D14 and D15 of the internal input data DIN to the first output lines OUT1<0:3> and the second output lines OUT2<0:3>, respectively. However, it is to be noted that the present disclosure is not limited thereto, and input data may be outputted in various sequences depending on a data input option.

The information storage circuit 250 may output an operating frequency information FQ_INF stored therein, according to the command CMD. The operating frequency information FQ_INF may include a read latency (RL) or a write latency (WL). Since the information storage circuit 250 of FIG. 2 is substantially the same as the information storage circuit 142 of FIG. 1, detailed descriptions thereof will be omitted herein.

The data alignment circuit 260 may include a data alignment block 262 and a data transfer block 264.

The data alignment block 262 may align and store the lower bit group transferred through the first and second output lines OUT1<0:3> and OUT2<0:3>, according to the first alignment control signal DINDQS<0:1>. Also, the data alignment block 262 may align the upper bit group transferred through the first and second output lines OUT1<0:3> and OUT2<0:3> according to the second alignment control signal DINDQS<2:3>, while selectively realigning the lower bit group stored therein depending on the operating frequency information FQ_INF. Moreover, the data alignment block 262 may output the aligned upper bit group as second alignment data DIN_U1<0:3> and DIN_U2<0:3> and output the realigned lower bit group as first alignment data DIN_D1<0:3> and DIN_D2<0:3>.

In detail, referring to FIG. 3, the data alignment block 262 may include first to third latch units 310, 320 and 330. The first latch unit 310 may store the lower bit group transferred through the first and second output lines OUT1<0:3> and OUT2<0:3>, according to the first alignment control signal DINDQS<0:1>. The second latch unit 320 may store the upper bit group transferred through the first and second output lines OUT1<0:3> and OUT2<0:3>, according to the second alignment control signal DINDQS<2:3>. The third latch unit 330 may be activated depending on the operating frequency information FQ_INF and re-store the lower bit group stored in the first latch unit 310 according to the second alignment control signal DINDQS<2:3>. In the meantime, in the case of being deactivated depending on the operating frequency information FQ_INF, the third latch unit 330 may not re-store the lower bit group stored in the first latch unit 310, and may bypass and output the lower bit group.

The first latch unit 310 may include first and second sub latch sections 312 and 314. The first sub latch section 312 may include four-unit latches which respectively store the four lower bits D0, D1, D4 and D5 transferred through the first output lines OUT1<0:3>, and output the stored lower bits D0, D1, D4 and D5 as intermediate data DIN_D11<0:3>, according to the first bit DINDQS<0> of the first alignment control signal DINDQS<0:1>. The second sub latch section 314 may include four-unit latches which respectively store the four lower bits D2, D3, D6 and D7 transferred through the second output lines OUT2<0:3>, and output the stored lower bits D0, D1, D4 and D5 as intermediate data DIN_D21<0:3>, according to the second bit DINDQS<1> of the first alignment control signal DINDQS<0:1>.

The second latch unit 320 may include third and fourth sub latch sections 322 and 324. The third sub latch section 322 may include four-unit latches which respectively store the four upper bits D8, D9, D12 and D13 transferred through the first output lines OUT1<0:3>, and output the second alignment data DIN_U1<0:3>, according to the first bit DINDQS<2> of the second alignment control signal DINDQS<2:3>. The fourth sub latch section 324 may include four-unit latches which respectively store the four upper bits D10, D1, D14 and D15 transferred through the second output lines OUT2<0:3>, and output the second alignment data DIN_U2<0:3>, according to the second bit DINDQS<3> of the second alignment control signal DINDQS<2:3>.

The third latch unit 330 may include fifth and sixth sub latch sections 332 and 334. The fifth sub latch section 332 is activated depending on the operating frequency information FQ_INF, and may include four-unit latches which respectively re-store the four lower bits D0, D1, D4 and D5 stored in the first sub latch section 312, i.e., the intermediate data DIN_D11<0:3>, and output the first alignment data DIN_D1<0:3>, according to the first bit DINDQS<2> of the second alignment control signal DINDQS<2:3>. The sixth sub latch section 334 is activated depending on the operating frequency information FQ_INF, and may include four-unit latches which respectively re-store the four lower bits D2, D3, D6 and D7 stored in the second sub latch section 314, i.e., the intermediate data DIN_D21<0:3>, and output the first alignment data DIN_D1<0:3>, according to the second bit DINDQS<3> of the second alignment control signal DINDQS<2:3>.

In the case of a high frequency operation in which the operating frequency information FQ_INF is higher than a predetermined frequency (for example, 2133 Mbps), the eight-unit latches disposed in the fifth sub latch section 332 and the sixth sub latch section 334 may be activated and output the re-stored lower bit group as the first alignment data DIN_D1<0:3> and DIN_D2<0:3>. Conversely, in the case of a low frequency operation in which the operating frequency information FQ_INF is equal to or lower than the predetermined frequency, the eight-unit latches disposed in the fifth sub latch section 332 and the sixth sub latch section 334 may be deactivated, and the outputs of the first sub latch section 312 and the second sub latch section 314 may be bypassed and outputted as the first alignment data DIN_D1<0:3> and DIN_D2<0:3>.

The data transfer block 264 may transfer the first alignment data DIN_D1<0:3> and DIN_D2<0:3> and the second alignment data DIN_U1<0:3> and DIN_U2<0:3> outputted from the data alignment block 262, to a global data line GIO as output data DATA_OUT<0:15> according to the transfer control signal DINSTPF. The data transfer block 264 may include a first transfer unit 264A corresponding to the first alignment data DIN_D1<0:3> and DIN_D2<0:3> and a second transfer unit 264B corresponding to the second alignment data DIN_U1<0:3> and DIN_U2<0:3>. The first transfer unit 264A and the second transfer unit 264B may be embodied as repeaters.

Referring back to FIG. 2, the internal circuit 270 includes a memory region 270A which includes a plurality of memory cells, and may perform an operation corresponding to the command CMD (for example, a read operation or a write operation) for the aligned data DATA_OUT<0:15> transferred through the global data line GIO, on the memory region 270A corresponding to an address ADDR, in synchronization with the internal clock signal ICLK.

In general, when a semiconductor device operates with a burst length of 16 (BL=16), in order to receive and align 16-bit data successively inputted in a write operation, lower 8-bit data should be latched until all of upper 8-bit data are inputted. In this case, a data latch time becomes a hold time of each bit*16. For example, in the case of a high frequency condition of 4266 Mbps, a data latch time of minimum 3.744 ns has to be ensured, and in the case of a low frequency condition of 2133 Mbps, a data latch time of minimum 7.488 ns has to be ensured. In order to ensure a data latch time in a high frequency operation tighter than a low frequency operation, the semiconductor device may further include the third latch unit 330 which latches once again previously latched lower 8-bit data in addition to the first and second latch units 310 and 320 which respectively latch lower 8-bit data and upper 8-bit data, thereby ensuring a stable data alignment operation against a skew variation.

The data alignment circuit 260 in accordance with the embodiment may ensure operational stability by activating the third latch unit 330 in a high frequency operation, and may reduce current consumption by deactivating the third latch unit 330 in a low frequency operation. That is, by performing a data alignment operation differently in a high frequency operation higher than a predetermined frequency and a low frequency operation equal to or lower than the predetermined frequency, it is possible to reduce current consumption due to the latches in the low frequency operation and ensure stability in the high frequency operation.

Hereinbelow, the operation of the memory device in accordance with the embodiment will be described with reference to FIGS. 1 to 5.

Figure 4:
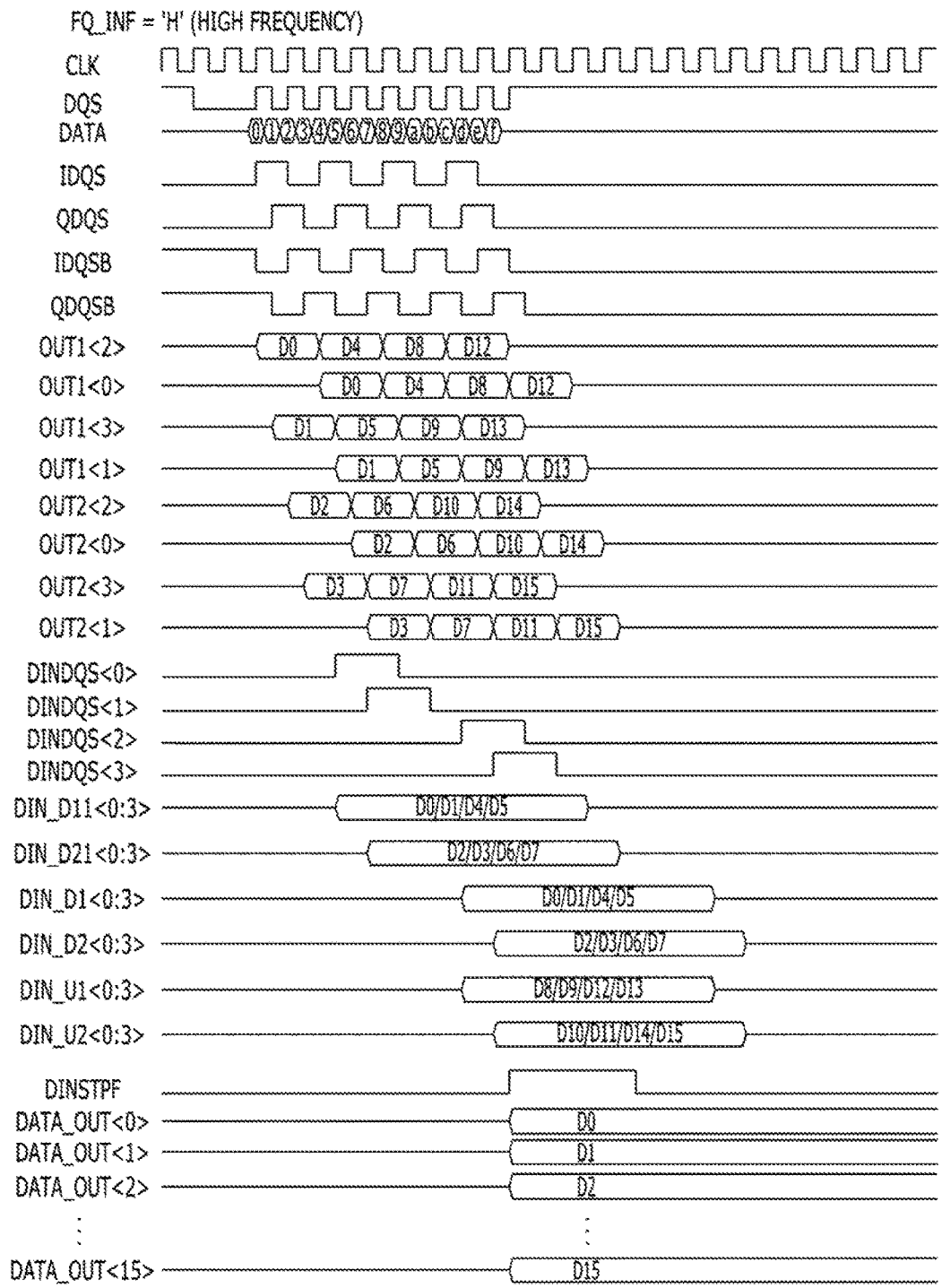
FIG. 4 is a waveform diagram explaining an operation of a memory device under a high frequency condition in accordance with an embodiment of the present invention.
Figure 5:
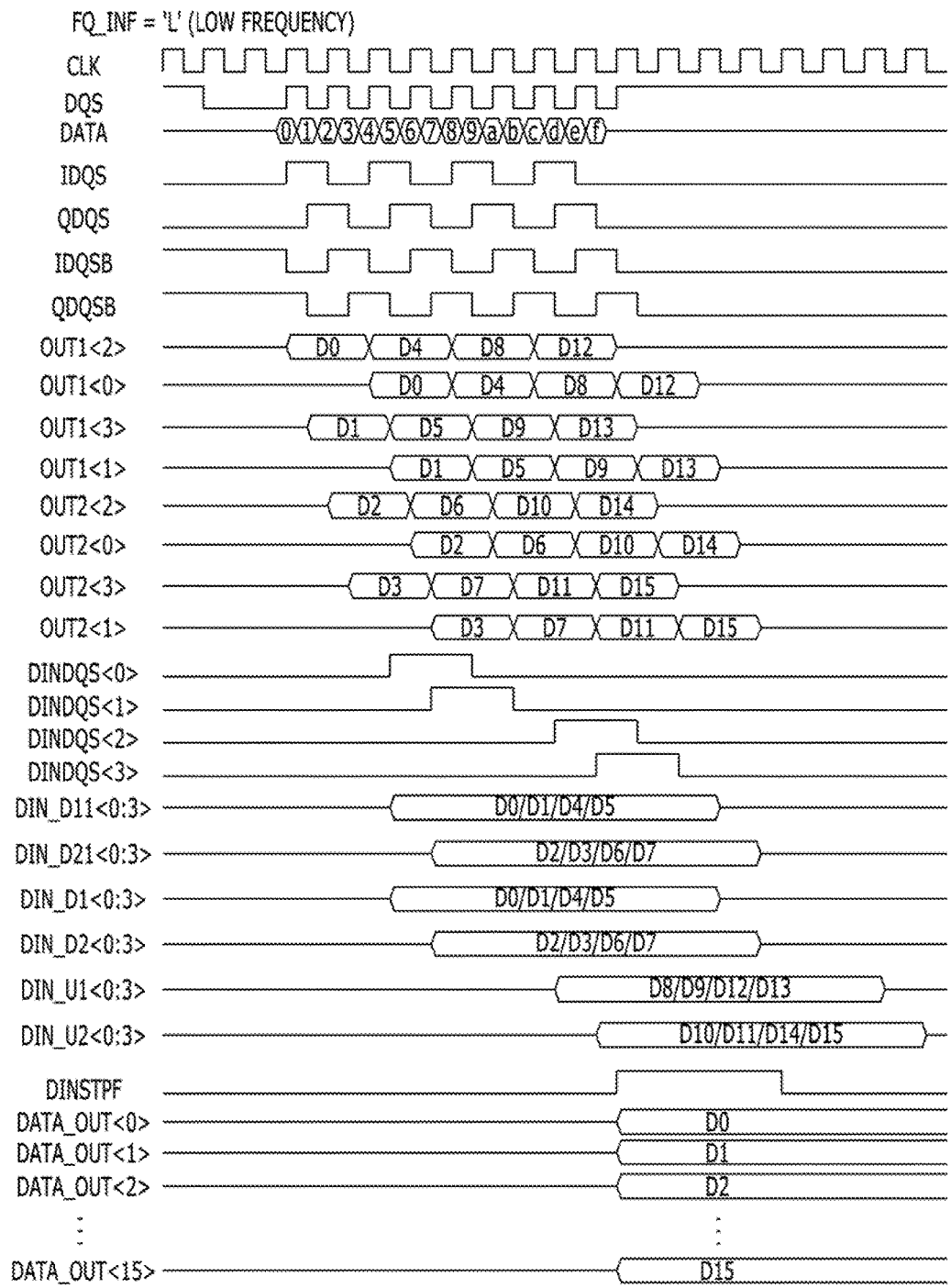
FIG. 5 is a waveform diagram explaining an operation of a memory device under a low frequency condition in accordance with an embodiment of the present invention.

FIG. 4 is a waveform diagram explaining an operation of a memory device under a high frequency condition in accordance with an embodiment of the present invention. FIG. 5 is a waveform diagram explaining an operation of a memory device under a low frequency condition in accordance with an embodiment of the present invention.

FIG. 4 illustrates a case where the operating frequency information FQ_INF has a logic high level indicating a high frequency operation, and FIG. 5 illustrates a case where the operating frequency information FQ_INF has a logic low level indicating a low frequency operation. In FIGS. 4 and 5, for the sake of convenience in explanation, descriptions will be made below by assuming that a high frequency operation is performed under a high frequency condition of 4266 Mbps, a low frequency operation is performed under a high frequency condition of 2133 Mbps and the transfer control signal DINSTPF is activated for 4 4*tCK.

Referring to FIGS. 4 and 5, 16-bit input data DATA are inputted in series through the data pad DQ_P, and the data strobe signal DQS is inputted through the data strobe pad DQS_P.

The strobe generation circuit 220 generates the first to fourth internal strobe signals IDQS, QDQS, IDQSB and QDQSB which are sequentially activated, by dividing the frequency of the data strobe signal DQS. Also, the strobe generation circuit 220 generates the first and second alignment control signals DINDQS<0:3> which are sequentially activated after a point of time at which all of the first to fourth internal strobe signals IDQS, QDQS, IDQSB and QDQSB are activated.

In response to the first to fourth internal strobe signals IDQS, QDQS, IDQSB and QDQSB, the pre-alignment circuit 240 outputs four lower bits D0, D1, D4 and D5 and four lower bits D2, D3, D6 and D7 of the input data DATA to the first output lines OUT1<0:3> and the second output lines OUT2<0:3>, respectively, and then outputs four upper bits D8, D9, D12 and D13 and four upper bits D10, D11, D14 and D15 of the input data DATA to the first output lines OUT1<0:3> and the second output lines OUT2<0:3>, respectively. Meanwhile, the data output sequences of the first output lines OUT1<0:3> and the second output lines OUT2<0:3> shown in FIGS. 4 and 5 are an illustration purpose only, and it is to be noted that the present disclosure is not limited thereto. In other words, through various methods, the pre-alignment circuit 240 may latch input data DATA by using the first to fourth internal strobe signals IDQS, QDQS, IDQSB and QDQSB, and may align the latched input data into a lower bit group and an upper bit group and sequentially output the lower bit group and the upper bit group to the first and second output lines OUT1<0:3> and OUT2<0:3>.

The first sub latch section 312 of the data alignment block 262 stores the four lower bits D0, D1, D4 and D5 transferred through the first output lines OUT1<0:3> according to the first bit DINDQS<0> of the first alignment control signal DINDQS<0:1>, and the second sub latch section 314 of the data alignment block 262 stores the four lower bits D2, D3, D6 and D7 transferred through the second output lines OUT2<0:3> according to the second bit DINDQS<1> of the first alignment control signal DINDQS<0:1>. Further, the third sub latch section 322 of the data alignment block 262 stores the four upper bits D8, D9, D12 and D13 transferred through the first output lines OUT1<0:3> according to the first bit DINDQS<2> of the second alignment control signal DINDQS<2:3>, and the fourth sub latch section 324 of the data alignment block 262 stores the four upper bits D10, D11, D14 and D15 transferred through the second output lines OUT2<0:3> according to the second bit DINDQS<3> of the second alignment control signal DINDQS<2:3>.

In the case of FIG. 4 in which the operating frequency information FQ_INF indicates a high frequency operation, the third latch unit 330 of the data alignment block 262 is activated. Accordingly, the fifth sub latch section 332 of the third latch unit 330 re-stores the intermediate data DIN_D11<0:3> outputted from the first sub latch section 312 according to the first bit DINDQS<2> of the second alignment control signal DINDQS<2:3>, and the sixth sub latch section 334 of the third latch unit 330 re-stores the intermediate data DIN_D21<0:3> outputted from the second sub latch section 314 according to the second bit DINDQS<3> of the second alignment control signal DINDQS<2:3>. The lower bit group re-stored in the fifth and sixth sub latch sections 332 and 334 is outputted as the first alignment data DIN_D1<0:3> and DIN_D2<0:3>. Namely, in the high frequency operation, in the case where the transfer control signal DINSTPF is activated for 4*tCK, a hold margin is approximately 4*0.468=1.872 ns, and thus, it is difficult to ensure operational stability due to a skew variation in the data latch time of 3.744 ns. Therefore, by storing once again the previously stored eight lower bits through activating the third latch unit 330, it is possible to ensure operational stability.

Conversely, in the case of FIG. 5 in which the operating frequency information FQ_INF indicates a low frequency operation, the fifth and sixth sub latch sections 332 and 334 of the data alignment block 262 are deactivated. Thus, the intermediate data DIN_D11<0:3> outputted from the first sub latch section 312 and the intermediate data DIN_D21<0:3> outputted from the second sub latch section 314 are bypassed and outputted as the first alignment data DIN_D1<0:3> and DIN_D2<0:3>. Namely, in the low frequency operation, in the case where the transfer control signal DINSTPF is 4*tCK, a hold margin is approximately 4*0.937=3.744 ns, and thus, it is possible to be prepared for a skew variation in the data latch time of 7.488 ns. Therefore, by deactivating the third latch unit 330, current consumption by eight-unit latches may be saved per one data pad DQ_P.

The clock buffer 230 activates the transfer control signal DINSTPF based on the clock signal CLK after all of the first alignment control signal DINDQS<0:1> and the second alignment control signal DINDQS<2:3> are activated. The data transfer block 264 may transfer the first alignment data DIN_D1<0:3> and DIN_D2<0:3> and the second alignment data DIN_U1<0:3> and DIN_U2<0:3> outputted from the data alignment block 262, to the global data line GIO as the output data DATA_OUT<0:15> according to the transfer control signal DINSTPF.

As is apparent from the above descriptions, in the data alignment circuit in accordance with the embodiment, by performing a data alignment operation differently in a high frequency operation higher than a predetermined frequency and a low frequency operation equal to or lower than the predetermined frequency, it is possible to reduce current consumption due to the latches in the low frequency operation and ensure stability in the high frequency operation.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   an information storage circuit suitable for outputting an operating frequency information according to a command; and
   a data alignment circuit suitable for storing a first bit group of input data in response to a first alignment control signal, storing a second bit group of the input data in response to a second alignment control signal which is activated after the first alignment control signal, and re-storing the stored first bit group in response to the second alignment control signal, wherein the re-storing is selectively performed depending on the operating frequency information.

2. The semiconductor device according to claim 1, wherein the operating frequency information includes a write latency or a read latency.

3. The semiconductor device according to claim 1, wherein the data alignment circuit includes a plurality of latches,
   wherein all of the plurality of latch units are activated when the operating frequency information indicates a high frequency operation, and
   wherein at least one latch unit among the plurality of latch units is deactivated when the operating frequency information indicates a low frequency operation.

4. The semiconductor device according to claim 1, wherein the information storage circuit includes a mode register set (MRS).

5. The semiconductor device according to claim 1, further comprising:
   a strobe generation circuit suitable for generating the first and second alignment control signals which are sequentially activated at a predetermined point of time in response to a data strobe signal.

6. The semiconductor device according to claim 5,
   wherein the strobe generation circuit divides a frequency of the data strobe signal, and generates first to fourth internal strobe signals which are respectively activated at first to fourth phases of the data strobe signal, and
   wherein the strobe generation circuit activates the first alignment control signal and the second alignment control signal after a point of time at which all of the first to fourth internal strobe signals are activated.

7. The semiconductor device according to claim 6, further comprising:
a pre-alignment circuit suitable for latching the input data by using the first to fourth internal strobe signals, aligning the latched input data into a first bit group and a second bit group, and providing the first bit group and the second bit group to the data alignment circuit.

8. The semiconductor device according to claim 1, wherein the data alignment circuit comprises:
a first latch unit suitable for storing the first bit group of the input data in response to the first alignment control signal;
a second latch unit suitable for storing the second bit group of the input data in response to the second alignment control signal; and
a third latch unit activated depending on the operating frequency information, and suitable for re-storing the first bit group stored in the first latch unit in response to the second alignment control signal.

9. The semiconductor device according to claim 1, wherein the first bit group includes lower bits of the input data, and
wherein the second bit group includes upper bits except for the lower bits of the input data.

10. The semiconductor device according to claim 1, further comprising:
a clock buffer suitable for generating a transfer control signal which is activated at a predetermined point of time, based on the command and a clock signal.

11. The semiconductor device according to claim 10, wherein the data alignment circuit further comprises:
a data transfer block suitable for transferring data aligned by the plurality of latch units, to a global data line in response to the transfer control signal.

12. A data alignment circuit comprising:
a first latch unit suitable for storing a first bit group of input data in response to a first alignment control signal;
a second latch unit suitable for storing a second bit group of the input data in response to a second alignment control signal which is activated after the first alignment control signal; and
a third latch unit activated depending on an operating frequency information, and suitable for re-storing the first bit group stored in the first latch unit in response to the second alignment control signal.

13. The data alignment circuit according to claim 12, wherein the first bit group includes lower bits of the input data, and
wherein the second bit group includes upper bits except for the lower bits of the input data.

14. The data alignment circuit according to claim 13, wherein the third latch unit is activated when the operating frequency information indicates a high frequency operation, and the third latch unit is deactivated and does not re-store and outputs the first bit group when the operating frequency information indicates a low frequency operation.

15. The data alignment circuit according to claim 12, wherein, in the case where the input data is M-bit serial data, M being an integer equal to or greater than 2, the first latch unit comprises:
a first sub latch section including unit latches which respectively store M/4 bits of the first bit group of the input data according to a first bit of the first alignment control signal; and
a second sub latch section including unit latches which respectively store remaining M/4 bits of the first bit group of the input data according to a second bit of the first alignment control signal.

16. The data alignment circuit according to claim 15, wherein the third latch unit comprises:
a fifth sub latch section activated depending on the operating frequency information, and including unit latches which respectively store the bits stored in the first sub latch section according to a first bit of the second alignment control signal; and
a sixth sub latch section activated depending on the operating frequency information, and including unit latches which respectively store the bits stored in the second sub latch section according to a second bit of the second alignment control signal.

17. The data alignment circuit according to claim 12, wherein, in the case where the input data is M-bit serial data, M being an integer equal to or greater than 2, the second latch unit comprises:
a third sub latch section including unit latches which respectively store M/4 bits of the second bit group of the input data according to a first bit of the second alignment control signal; and
a fourth sub latch section including unit latches which respectively store remaining M/4 bits of the second bit group of the input data according to a second bit of the second alignment control signal.

18. A data alignment operation comprising:
storing a first bit group of input data in response to a first alignment control signal;
storing a second bit group of the input data in response to a second alignment control signal which is activated after the first alignment control signal; and
re-storing the stored first bit group in response to the second alignment control signal,
wherein the re-storing is selectively performed depending on an operating frequency information.

19. The data alignment operation according to claim 18, wherein the re-storing of the stored first bit group is performed when the operating frequency information indicates a high frequency operation, and the re-storing of the stored first bit group is skipped when the operating frequency information indicates a low frequency operation.

20. The data alignment operation according to claim 18, wherein the first bit group includes lower bits of the input data, and
wherein the second bit group includes upper bits except for the lower bits of the input data.

* * * * *